United States Patent
Ueta

(10) Patent No.: US 7,892,886 B2
(45) Date of Patent: Feb. 22, 2011

(54) SEMICONDUCTOR CHIP AND SEMICONDUCTOR DEVICE, AND METHOD OF MANUFACTURING THE SAME

(75) Inventor: Koji Ueta, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 114 days.

(21) Appl. No.: 12/385,880

(22) Filed: Apr. 22, 2009

(65) Prior Publication Data

US 2009/0289331 A1    Nov. 26, 2009

(30) Foreign Application Priority Data

May 22, 2008  (JP)  ............................. 2008-133784

(51) Int. Cl.
H01L 21/00 (2006.01)
H01L 29/06 (2006.01)
(52) U.S. Cl. ................. 438/107; 438/109; 257/618; 257/E23.179; 257/E21.499
(58) Field of Classification Search ................ None
See application file for complete search history.

(56) References Cited

U.S. PATENT DOCUMENTS

| 5,644,102 A * | 7/1997 | Rostoker ............... 174/547 |
| 6,204,564 B1 * | 3/2001 | Miyata et al. ........... 257/778 |
| 2010/0044858 A1 * | 2/2010 | Cohn et al. ............ 257/734 |

FOREIGN PATENT DOCUMENTS

JP    2000-228341    8/2000

* cited by examiner

Primary Examiner—Julio J Maldonado
Assistant Examiner—Shaka Scarlett
(74) Attorney, Agent, or Firm—McGinn IP Law Group, PLLC

(57) ABSTRACT

At least a part of an outer edge of a surface where a circuit forming region, for example, of a semiconductor substrate that forms a semiconductor chip is arranged (a region surrounded by a scribe line around the circuit forming region) is cut or polished, so as to form a smooth slope is chamfered non-parallel and non-vertical to the circuit forming region. Then, a code indicating management information is assigned to the slope. Further, a plurality of semiconductor chips are stacked to manufacture a semiconductor device.

5 Claims, 2 Drawing Sheets

30 WAFER
30a ORIENTATION FLAT
1 SEMICONDUCTOR CHIP

1
CIRCUIT FORMING REGION 10
11 PAD
12 DATA REGION

A00001-2-22
— COORDINATE IN WAFER
— WAFER NUMBER
— LOT NUMBER

SEMICONDUCTOR CHIP AND SEMICONDUCTOR DEVICE, AND METHOD OF MANUFACTURING THE SAME

BACKGROUND

1. Field of the Invention

The present invention relates to a semiconductor chip and a semiconductor device, and a method of manufacturing the same, and more specifically, to a technique of assigning management information to a semiconductor chip in a manufacturing process for analysis in case of breakdown or failure.

2. Description of Related Art

A typical manufacturing method of a semiconductor chip using the technique of assigning the management information as above is disclosed, for example, in Japanese Unexamined Patent Application Publication No. 2000-228341 (Shioashi et al.).

In this manufacturing method, a semiconductor chip 1 shown in FIG. 2A that is regularly formed in an X coordinate axis direction and a Y coordinate axis direction is separated by cutting (dicing) a wafer 30. The X coordinate axis is set in a direction that is parallel with an orientation flat 30a (one of crystal axis direction in the surface of the wafer 30) shown in FIG. 2A, and the Y coordinate axis is set in a direction that is vertical to the orientation flat 30a.

Further, the semiconductor chip 1 includes, as shown in FIG. 2B, a plurality of bonding pads (hereinafter simply referred to as pads) 11, various circuit elements (not shown), and a data region 12 arranged in a circuit forming region 10 provided on the surface thereof. The management information is written in the data region 12.

More specifically, as shown in FIG. 2C, for example, numerals "1" to "10 (shown as "0" in FIG. 2C)" or alphabets "A" to "J" are made correspondent to the vertical direction of the data region 12, and information composed of a lot number="A00001" in the manufacturing process, a wafer number="2", and coordinates in the wafer (values on the X and Y coordinate axes as described above) is encoded to be written as the management information.

The management information written to the surface of the semiconductor chip 1 can be read out in case of breakdown or failure, so as to employ the information to analyze the cause of the breakdown or the failure. Shioashi et al. also discloses a method of providing the data region 12 in the rear surface of the semiconductor chip 1 for the sake of writing as much management information as possible (recording the management information without being limited by the size of the empty space of the circuit forming region 10 or the capacity of the data region 12).

SUMMARY

In order to deal with recent high-density mounting of a semiconductor integrated circuit, an SIP (System In Package) method in which a plurality of semiconductor chips are stacked on one wiring board for mounting (packaging) has been widely employed.

However, the present inventors have found a problem as follows. That is, according to Shioashi et al., it is difficult to read out the management information in the semiconductor chip mounted lower than other semiconductor chips by using the SIP method.

To be more specific, the circuit forming region of the lower semiconductor chip is hidden below an upper semiconductor chip. Thus, the upper semiconductor chip needs to be removed in order to read out the management information. In this case, it is desired to read out the management information while keeping the function (stack structure) of the semiconductor device in analyzing the breakdown or the failure. However, the connection relationship between the semiconductor chips is broken due to the removal of the upper semiconductor chip, which impairs the function of the semiconductor device.

A first exemplary aspect of an embodiment of the present invention is a semiconductor chip including first and second principal surfaces that are opposed to each other, and a slope that is non-parallel and non-vertical to the first principal surface, the slope being formed by chamfering at least a part of an outer edge of the first principal surface. A semiconductor circuit is formed on at least one of the first and second principal surfaces, and information is displayed on the slope.

A second exemplary aspect of an embodiment of the present invention is a method of manufacturing a semiconductor chip including first and second principal surfaces that are opposed to each other and a semiconductor circuit that is formed on at least one of the first and second principal surfaces. This manufacturing method includes chamfering at least a part of an outer edge of the first principal surface in a way that the part is non-parallel and non-vertical to the first principal surface, and assigning information to the slope that is formed by the chamfering.

In summary, according to the present invention, the management information is assigned (displayed) on the slope that is formed to be non-parallel and non-vertical to one principal surface of the semiconductor chip. As such, the management information can be read out from a side surface direction of the semiconductor chip. Accordingly, even when the plurality of semiconductor chips are stacked (laminated), the management information of each semiconductor chip can be read out without impairing the stack structure.

According to the present invention, the management information can be read out with ease compared with the method of Shioashi et al., whereby it is possible to carry out the analysis effectively and accurately when the breakdown, failure or the like occurs in the semiconductor chip and the semiconductor device.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The exemplary embodiment of a semiconductor chip and a semiconductor device, and a method of manufacturing the same according to the present invention will be described with reference to FIGS. 1A to 1D. The manufacturing process of the semiconductor chip according to the exemplary embodiment is shown by processes (1) to (3) in FIGS. 1A to 1C, and the manufacturing process of the semiconductor device is shown by the processes (1) to (3) and a process (4) in FIG. 1D.

Now, the manufacturing processes (1) to (4) will be described in this order.

[Manufacturing Process (1)]

Figure 1A:
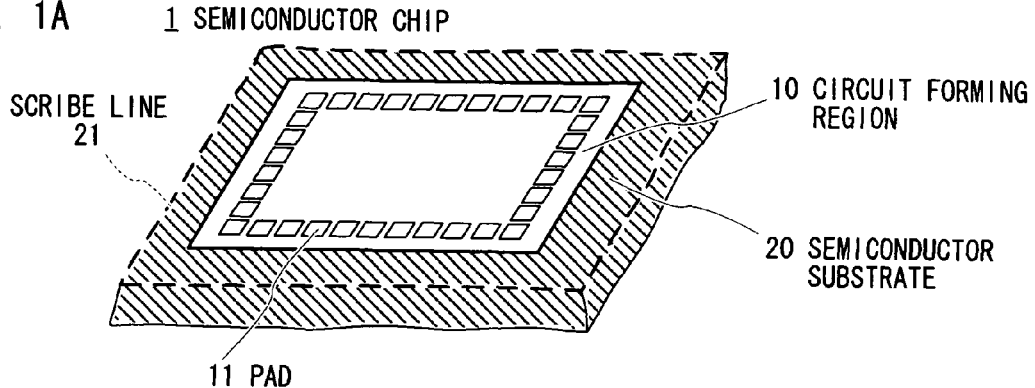
FIGS. 1A to 1D each shows an example of a manufacturing process of a semiconductor chip and a semiconductor device according to the present invention.
Figure 2A:
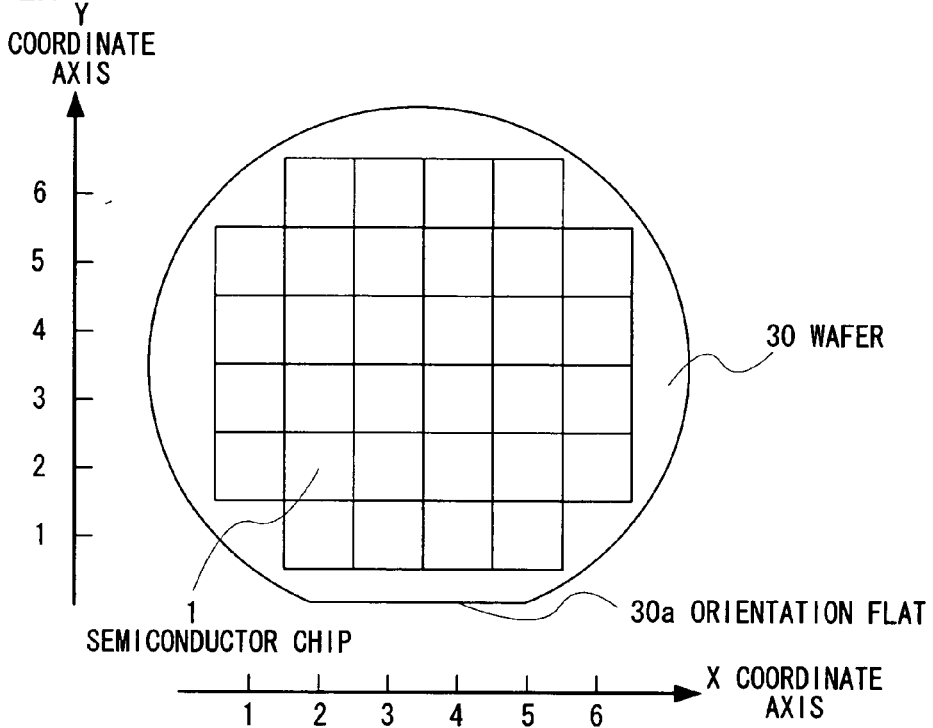
FIGS. 2A to 2C each shows an example of assigning management information in a typical semiconductor chip.
Figure 2B:
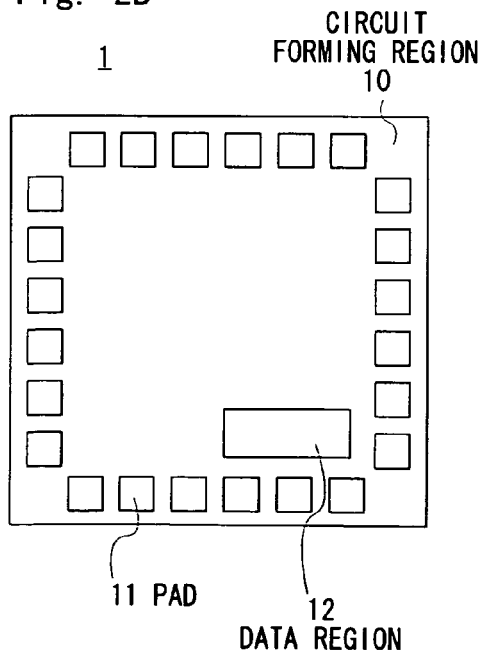
Figure 2C:
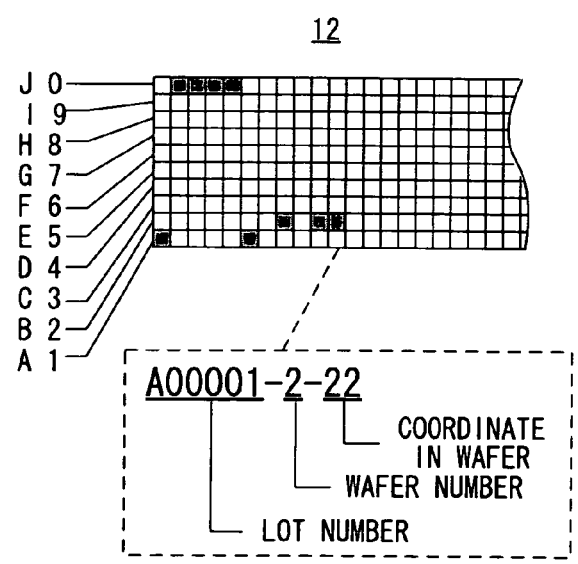

First, as shown in FIG. 1A, a semiconductor substrate 20 is diced along a scribe line (ridge line) 21 from a wafer (not shown), to cut off a semiconductor chip 1. The side surface of the semiconductor substrate 20 is not completely smooth as shown in FIG. 1A. Further, on the surface of the semiconductor substrate 20, a circuit forming region 10 where pads 11 and various circuit elements (not shown) are arranged is provided, as is similar to FIG. 2B. However, as is different from FIG. 2B, the data region 12 is not arranged in the circuit forming region 10.

[Manufacturing Process (2)]

Figure 1B:
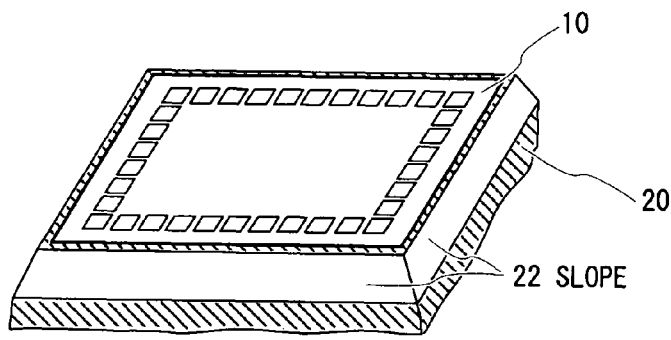

After the above process (1) above, an outer edge (more specifically, a region surrounded by the scribe line 21 around the circuit forming region 10) of the semiconductor substrate 20 shown in FIG. 1A is obliquely cut or polished with respect to the circuit forming region 10, so as to form a smooth slope 22 as shown in FIG. 1B.

[Manufacturing Process (3)]

Figure 1C:
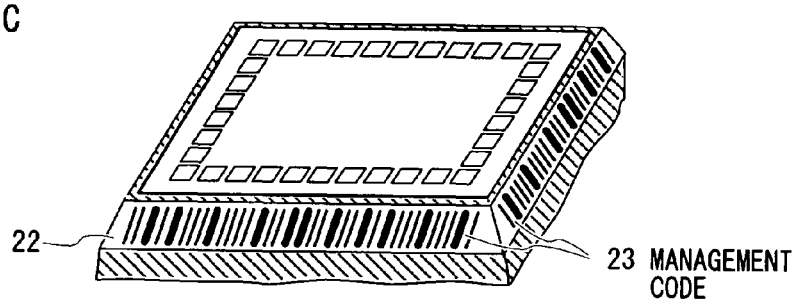

After the above process (2), as shown in FIG. 1C, a code (hereinafter referred to as management code) 23 indicating the management information of the semiconductor chip 1 (lot number, open-date or the like) is assigned to the slope 22. The slope 22 is formed with smooth in the above process (2). Accordingly, the management code 23 assigned to the slope 22 can be accurately read out.

[Manufacturing Process (4)]

Figure 1D:
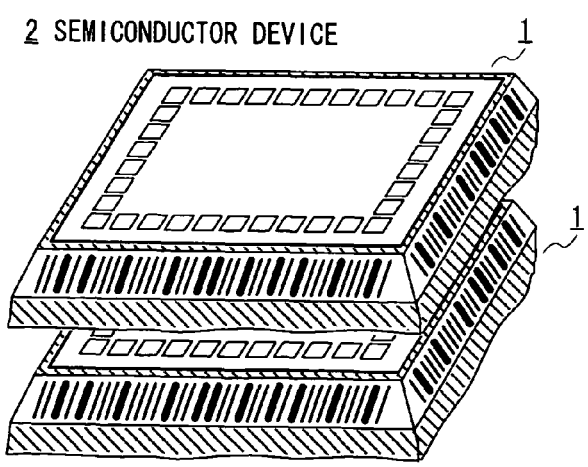

Then, as shown in FIG. 1D, a plurality of semiconductor chips 1 (two chips, in this example) manufactured in the above process (3) are stacked on a wiring board (not shown), so as to manufacture a semiconductor device 2.

In the semiconductor device 2 thus manufactured, the management code 23 of each semiconductor chip 1 can be seen from the side surface thereof, as shown in FIG. 1D. Accordingly, even when the breakdown, the failure or the like occurs, the management code of each semiconductor chip can be read out without impairing the stack structure of the semiconductor device.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

For example, in FIGS. 1B and 1C, the slope 22 is formed in the whole side surfaces of the semiconductor substrate 20 to assign the management code 23. However, the slope may be formed at least in one side surface of the semiconductor substrate 20 to add the management code 23. In this case, the above manufacturing processes (2) and (3) can be simplified, whereby the semiconductor chip 1 can be rapidly manufactured.

Further, the slope 22 may be formed in the rear surface of the semiconductor substrate 20 to assign the management code 23. By doing so, the management code of each semiconductor chip can be read out even when the circuit forming regions of the semiconductor chips are opposedly stacked, for example.

Further, it is also possible to form the slope only in a part of the semiconductor chip in the semiconductor device to assign the management code. Even in this case, the management code can be seen from the side of the semiconductor device and can be read out.

What is claimed is:

1. A semiconductor chip comprising:

first and second principal surfaces that are opposed to each other; and a slope that is non-parallel and non-vertical to the first principal surface, the slope being formed by chamfering at least a part of an outer edge of the first principal surface, wherein a semiconductor circuit is formed on at least one of the first and second principal surfaces, and information is displayed on the slope.

2. A semiconductor device comprising:

a semiconductor chip including first and second principal surfaces that are opposed to each other, and a slope that is non-parallel and non-vertical to the first principal surface, the slope being formed by chamfering at least a part of an outer edge of the first principal surface; and another semiconductor chip that is stacked on the first principal surface of the semiconductor chip, wherein a semiconductor circuit is formed on at least one of the first and second principal surfaces, and information is displayed on the slope.

3. A method of manufacturing a semiconductor chip including first and second principal surfaces that are opposed to each other and a semiconductor circuit that is formed in at least one of the first and second principal surfaces, the method comprising:

chamfering at least a part of an outer edge of the first principal surface in a way that the part is non-parallel and non-vertical to the first principal surface; and assigning information to the slope that is formed by the chamfering.

4. The method of manufacturing the semiconductor chip according to claim 3, wherein at least the part of the outer edge is cut or polished to form the slope to be smooth in the chamfering.

5. A method of manufacturing a semiconductor device, comprising:

chamfering at least a part of an outer edge of a first principal surface of a semiconductor chip including first and second principal surfaces that are opposed to each other and a semiconductor circuit that is formed on at least one of the first and second principal surfaces in a way that the part is non-parallel and non-vertical to the first principal surface, and assigning information to a slope that is formed by the chamfering; and stacking another semiconductor chip on the first principal surface of the semiconductor chip.

* * * * *